(12) United States Patent
Lou

(10) Patent No.: US 7,026,842 B1
(45) Date of Patent: Apr. 11, 2006

(54) METHOD AND APPARATUS FOR RELIABLE PULSE EVENT DETECTION

(75) Inventor: Wenkwei Lou, San Diego, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 11/087,526

(22) Filed: Mar. 23, 2005

Related U.S. Application Data

(60) Provisional application No. 60/618,521, filed on Oct. 13, 2004.

(51) Int. Cl.
*H03K 5/19* (2006.01)

(52) U.S. Cl. .............................. 327/20; 327/24; 327/29

(58) Field of Classification Search ...................... None
See application file for complete search history.

(56) References Cited

U.S. PATENT DOCUMENTS

| | | | | |
|---|---|---|---|---|
| 4,940,904 A | * | 7/1990 | Lin | 327/256 |
| 5,751,692 A | * | 5/1998 | Kiml | 327/20 |
| 6,636,080 B1 | * | 10/2003 | Soda | 327/24 |
| 6,772,260 B1 | * | 8/2004 | Kawase et al. | 710/264 |
| 6,931,075 B1 | * | 8/2005 | Schlanger et al. | 375/259 |

* cited by examiner

*Primary Examiner*—Tuan T. Lam
(74) *Attorney, Agent, or Firm*—Christie, Parker & Hale, LLP

(57) ABSTRACT

A circuit for detecting asynchronous events includes a first event detection latch; and a second event detection latch coupled to the first event detection latch, wherein the first event detection latch is ready to detect an event when the second event detection latch is being reset and wherein the second event detection latch is ready to detect a next event when the first event detection latch is being reset.

20 Claims, 4 Drawing Sheets

METHOD AND APPARATUS FOR RELIABLE PULSE EVENT DETECTION

CROSS-REFERENCE TO RELATED APPLICATION

This Patent Application claims the benefit of the filing date of U.S. Provisional Patent Application Ser. No. 60/618,521, filed on Oct. 13, 2004 and entitled "METHOD AND APPARATUS FOR RELIABLE PULSE EVENT DETECTION," the entire content of which is hereby expressly incorporated by reference.

FIELD OF THE INVENTION

The present invention relates generally to electronic circuits; and more particularly to pulse event detection method and circuit.

BACKGROUND OF THE INVENTION

Pulse event detection is common among electronic systems. It can be performed by synchronous or asynchronous methods depending on the requirement of the system. The asynchronous method detects pulses, without the use of a clock and is suited for low power operations of a mouse button or keyboard events, for example. However, in the operation of a typical asynchronous event detection, shown in FIG. 1, the event pulse might be missed depending on the frequency of the events.

For example, when a rising edge event is latched in latch 10, it triggers an interrupt 13 to a processor. After, being interrupted, the processor typically clears the event latched in latch 10 by writing to a memory location. The write operation to the memory by the processor generates a low going pulse at 12 and asynchronously clears the latch 10. The problem arises when there is an incoming rising edge next event during this interrupt-driven clear cycle.

For example, after the pulse event is acknowledged and processed by a control unit of the system (e.g., a processor), the detection circuit has to be cleared and re-armed for detection of next event. It is likely that the clearing of the detection circuit masks a new incoming edge event. This causes the new incoming event to be missed and lost.

Therefore, there is a need for an circuit and method for a more reliable pulse event detection.

SUMMARY OF THE INVENTION

The present invention is related to a solution to the above problem by employing a redundancy edge and/or level detection circuit including an edge and a level pulse detection logic, or another edge detection circuit. The present invention solves the above problem by a new design including a(n) edge/level detection latch, which begins detection after the rising edge of the "clear" pulse. In this case, the processor can check the interrupt right after the "clear" signal to make sure no edge occurs.

In one embodiment, the invention is a circuit for detecting asynchronous events. The circuit includes a first event detection latch; and a second event detection latch coupled to the first event detection latch, wherein the first event detection latch is ready to detect an event when the second event detection latch is being reset and wherein the second event detection latch is ready to detect a next event when the first event detection latch is being reset.

In one embodiment, the invention is a method for detecting asynchronous events. The method includes detecting a first event by a first event detection circuit; resetting the first event detection circuit after the first event is detected; detecting a second event by a second event detection circuit; and resetting the second event detection circuit after the second event is detected, wherein the first event detection circuit is ready to detect an event when the second event detection circuit is being reset and wherein the second event detection circuit is ready to detect a next event when the first event detection circuit is being reset.

In one embodiment, the invention is a programmable circuit for detecting event signal. The circuit includes a first programmable event detection circuit for detecting one of the group consisting a rising edge event, a falling edge event, a high level event, and a low level event; and a second programmable event detection circuit coupled to the first programmable event detection latch for detecting one of the group consisting a rising edge event, a falling edge event, a high level event, and a low level event, wherein the first and second programmable event detection circuits operate in a ping-pong manner for detecting events.

DETAILED DESCRIPTION

Figure 1:
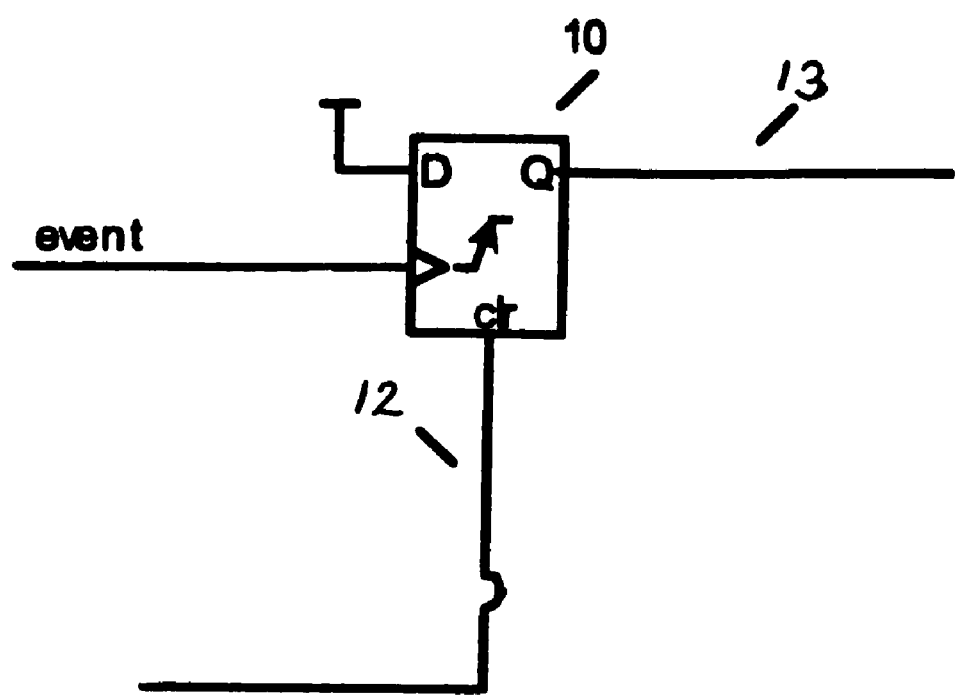
FIG. 1 shows a typical asynchronous event detection circuit.
Figure 2:
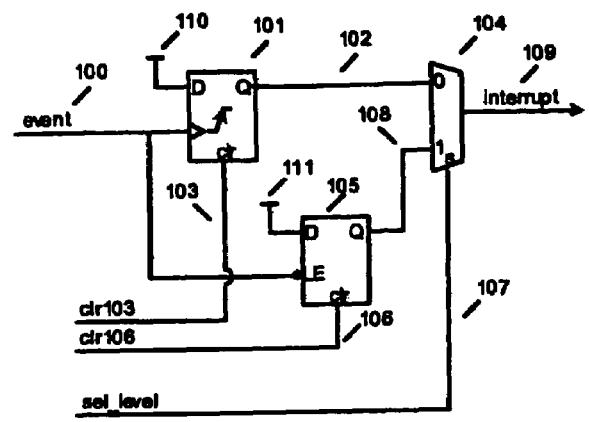
FIG. 2 is an exemplary circuit diagram for a reliable pulse event detection method and apparatus, according to one embodiment of the invention.

In one embodiment, the present invention is directed to a method and apparatus for a reliable pulse event detection. FIG. 2 is an exemplary circuit diagram for a reliable pulse event detection method and apparatus, according to one embodiment of the invention. As shown, latch 101 detects the rising edge of the event 100 by latching a "high" 110 at its output 102. Multiplexer 104, controlled by the sel_level signal 107 (from the processor), selects the latched high output 102 to generate an interrupt signal 109. Once interrupted, the processor attempts to clear (re-arm) latch 101 for detection of the next event. This is performed by sending a clr 103 signal 103 used to clear latch 101. At the same time, the processor toggles the sel_level signal 107, used to control the multiplexor 104.

Figure 3:
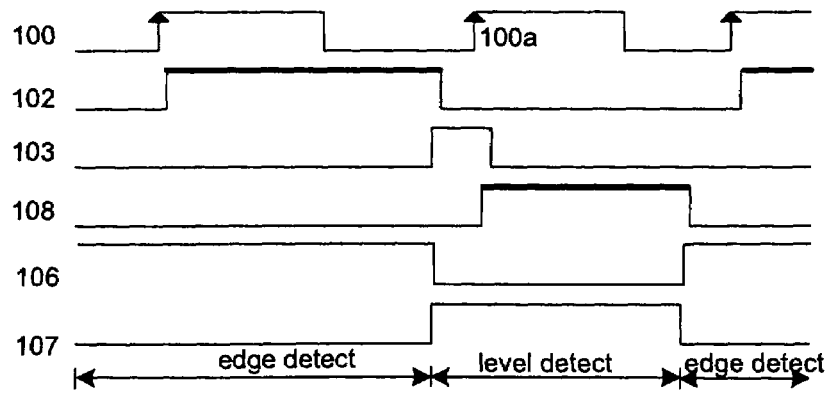
FIG. 3 is an exemplary timing diagram for circuit of FIG. 2.

However, while latch 101 is being cleared by the clr 103, the next event 100a may occur, as shown by the exemplary timing diagram of FIG. 3. This next event will be missed by latch 101, because clr 103 pulse 103 is still high, as shown in FIG. 3. Nevertheless, next event 10a is captured by the level detection latch 105 by clocking a high (i.e., 111) to its output 108, as shown in the timing diagram of FIG. 3. Since the processor is still performing the interrupt routine, the write operation, and/or generating the clr 103 signal, it toggles the sel_level signal 107 from an "edge detect" mode to a "level detect" mode, as shown in the timing diagram of FIG. 3. As a result, the multiplexor 104 selects the high output 108 of the latch 105, as a second interrupt 109 to the processor, as the detection of the second event 100a. This way, the level detection latch 105 begins detection right after the rising edge of the clr 103 pulse 103 and processor can check the interrupt 109 right after clr 103 to make sure no event edge occurs.

Although, in the exemplary circuit of FIG. 2, latch 105 is depicted as a level detector, those skilled in the art will understand that latch 105 can be an edge detector similar to latch 101. Likewise, latch 101 may be a level detector similar to latch 105, depending on the application. In one embodiment, the two edge/level detector latches 101 and 105 operate in a "ping-pong" manner, in which while latch 101 is being reset (by the processor), latch 105 is ready for operation, and when latch 105 is being reset, latch 101 is ready for operation. In other words, in this manner, the two latched alternate to detect the next coming events.

Figure 4:
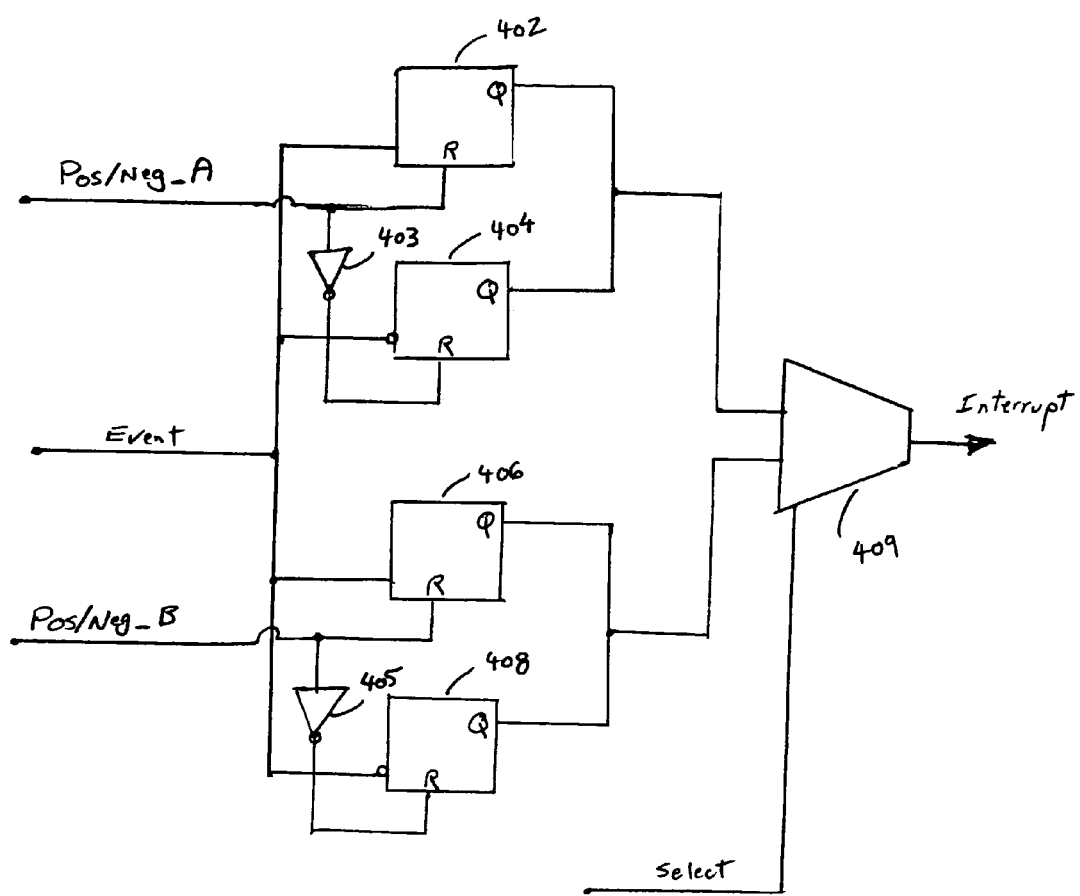
FIG. 4 depicts an exemplary block diagram for a pulse event detection capable of detecting a rising edge event and/or a falling edge event, according to one embodiment of the present invention.

FIG. 4 is an exemplary block diagram for a programmable pulse event detection capable of detecting a rising edge event and/or a falling edge event, according to one embodiment of the present invention. It is understood that the programmable pulse event detection of FIG. 4 may be designed to detect a high level event and/or a low level event, as discussed above with respect to FIG. 2.

As shown in FIG. 4, latches 402 and 406 detect a positive edge event and latched 404 and 408 detect a negative edge event. A first control signal Pos/Neg_A controls whether the top detection circuit detects a positive edge or a negative edge by enabling and disabling (via the invertor 403) the respective latches 402 and 404. For example, if the control signal Pos/Neg_A is low, the positive edge detector latch 402 is enabled and the negative edge detector latch 404 is disabled. In one embodiment, the output of the disabled latch 404 is connected to the output of the positive edge detector latch 402. In this embodiment, the output of the disabled latched is tri-stated, so that the respective inputs to the MUX 409 are controlled by the enabled latches, respectively.

Similarly, a second control signal Pos/Neg_B controls whether the bottom detection circuit detects a positive edge or a negative edge by enabling and disabling (via the invertor 405) the respective latches 406 and 408. The two output of the top detection circuit and the bottom detection circuit are (alternatively) selected by the MUX 409. The Select signal controlling the MUX 409 may be controlled by the processor. Alternatively, the Select signal may be a simple toggle switch that selects the top and the bottom detection circuits in a ping-pong fashion.

As described above, one or both of the top and bottom detection circuits may be a (high and/or a low) level detection circuit. In one embodiment, the first control signal Pos/Neg_A and the second control signal Pos/Neg_B are the same signal.

Figure 5:
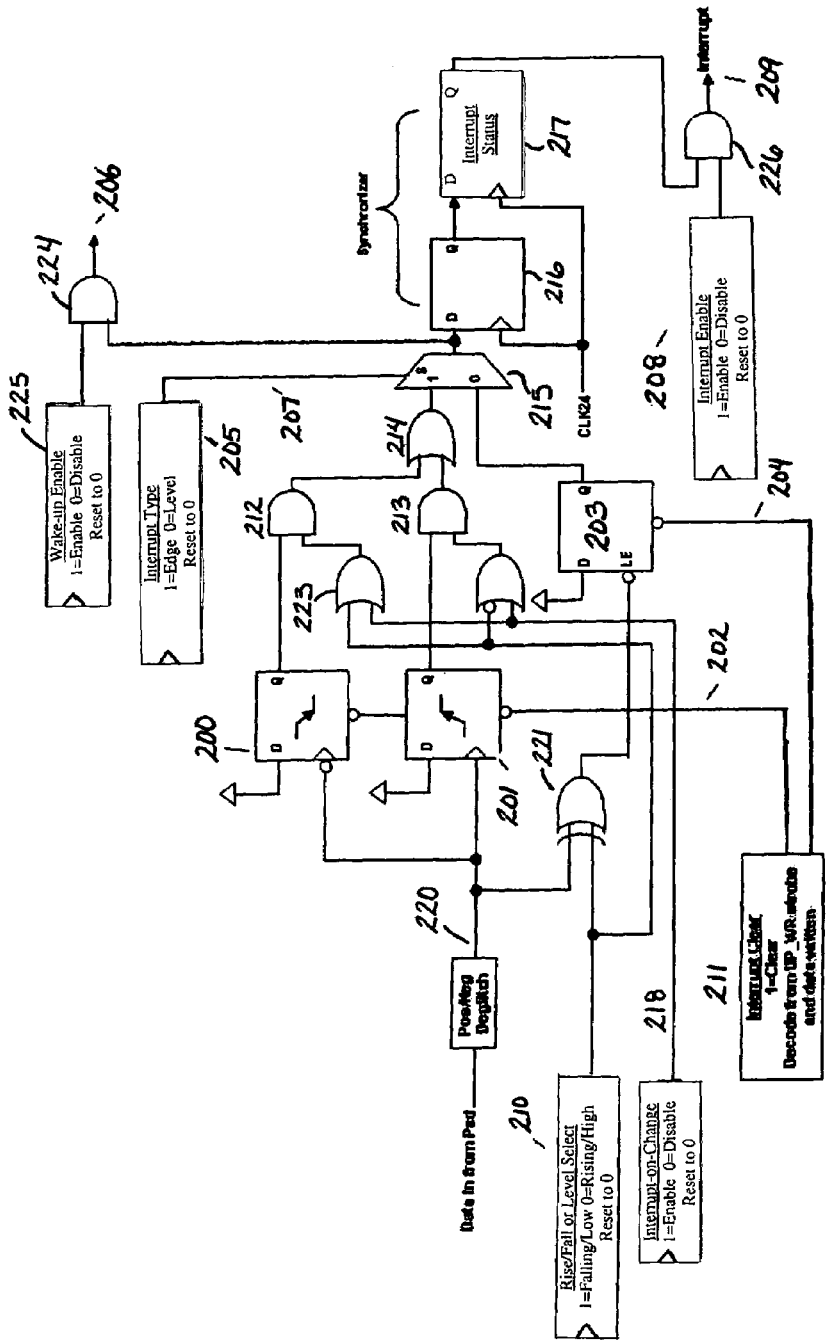
FIG. 5 is an exemplary circuit diagram for a pulse event detection capable of detecting a rising edge event and/or a falling edge event, according to one embodiment of the present invention.

FIG. 5 depicts an exemplary circuit diagram for a reliable pulse event detection capable of detecting a rising edge event (by latch 201) and/or a falling edge event (by latch 200), according to one embodiment of the present invention. A rising edge and/or a falling edge event detection is programmable by control signals 210 and/or 218. The two Nand gates 212 and 213 and the Or gate 214, select the output of latch 201 as the rising edge detected event, or the output of latch 200 as the falling edge detected event, based on the control signal 210. The output of the Or gate 214 is then fed to a multiplexor 215.

If the circuit is in the edge detection mode, this output of the Or gate 214 is fed through the multiplexor 215 and is synchronized by the latches 216 and 217, before it is input to the processor as an interrupt signal 209. The interrupt signal 209 may be disabled by the signal 208 (that may come from the processor) via the Nand gate 226.

Similarly, when the edge detection latches 200 and 201 are being reset by signal 202, latch 203 is ready to detect the next event, as described above with respect to FIG. 2. Multiplexor 215 is controlled by select signal 207, depending on the interrupt type. That is, the output of Or gate 214 is selected by the multiplexor, if edge detection is enabled. Alternatively, the output of the level detection latch 203 is selected, if level detection is enabled. Signal 218 programs the detection circuit to perform both rising edge and falling detections.

The reset signals 202 and 204 clear the edge detection latches 200 and 201, and the level detection latch 203, respectively. In one embodiment, the reset signals are generated from the write signal of the processor in box 211. Signal 206 is used as a "wake up" signal for power management purposes. That is, when an event is detected, the system is "woken up" from a power stand by mode. The "wake up" signal 206 can be disabled via the And gate 224.

Again, as discussed above, one or more of the latches 200 and 201 can be a (high and/or low) level detector latches.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A circuit for detecting asynchronous events comprising:
a first event detection latch; and
a second event detection latch coupled to the first event detection latch, wherein the first event detection latch is ready to detect an event when the second event detection latch is being reset and wherein the second event detection latch is ready to detect a next event when the first event detection latch is being reset.

2. The circuit of claim 1, wherein the first event detection latch is an edge detection latch.

3. The circuit of claim 2, wherein the first event detection latch detects a rising edge event.

4. The circuit of claim 2, wherein the first event detection latch detects a falling edge event.

5. The circuit of claim 1, wherein the second event detection latch is an edge detection latch.

6. The circuit of claim 5, wherein the second event detection latch detects a rising edge event.

7. The circuit of claim 5, wherein the second event detection latch detects a falling edge event.

8. The circuit of claim 1, wherein the first event detection latch is a high level event detection latch.

9. The circuit of claim 2, wherein the first event detection latch is a low level event detection latch.

10. The circuit of claim 1, further comprising a third and fourth event detection latches and a programming signal for programming each of the first, second, third, and fourth event detection latches to detect one of the group consisting a rising edge event, a falling edge event, a high level event, and a low level event.

11. The circuit of claim 1, further comprising a multiplexor coupled to the first and second event detection latches for selecting one of the outputs of the first or second event detection latches.

12. The circuit of claim 1, further comprising a synchronizer circuit for synchronizing the output of the multiplexor and inputting the synchronized signal to a processor as an interrupt signal.

13. A method for detecting asynchronous events, the method comprising:
   detecting a first event by a first event detection circuit;
   resetting the first event detection circuit after the first event is detected;
   detecting a second event by a second event detection circuit; and
   resetting the second event detection circuit after the second event is detected, wherein the first event detection circuit is ready to detect an event when the second event detection circuit is being reset and wherein the second event detection circuit is ready to detect a next event when the first event detection circuit is being reset.

14. The method of claim 13, further comprising programming the first and second event detection circuits for detecting one of the group consisting a rising edge event, a falling edge event, a high level event, and a low level event.

15. The method of claim 13, further comprising selecting one of the outputs of the first or second event detection latches.

16. The method of claim 15, further comprising synchronizing the selected signal and inputting the synchronized signal to a processor as an interrupt signal.

17. A programmable circuit for detecting event signals comprising:
   a first programmable event detection circuit for detecting one of the group consisting a rising edge event, a falling edge event, a high level event, and a low level event; and
   a second programmable event detection circuit coupled to the first programmable event detection circuit for detecting one of the group consisting a rising edge event, a falling edge event, a high level event, and a low level event, wherein the first and second programmable event detection circuits operate in a ping-pong manner for detecting events.

18. The circuit of claim 17, further comprising a multiplexor coupled to the first and second event detection circuits for selecting one of the outputs of the first or second event detection circuits.

19. The circuit of claim 17, further comprising a synchronizer circuit for synchronizing the output of the multiplexor and inputting the synchronized signal to a processor as an interrupt signal.

20. The circuit of claim 19, wherein the output of the multiplexor is selected by the processor.

* * * * *